United States Patent
Hu

[19]

[11] Patent Number: 5,804,991

[45] Date of Patent: *Sep. 8, 1998

[54] ZERO CROSSING CIRCUIT FOR A RELAY

[75] Inventor: Charles C. Hu, Saratoga, Calif.

[73] Assignee: The Watt Stopper, Santa Clara, Calif.

[*] Notice: The term of this patent shall not extend beyond the expiration date of Pat. No. 5,640,113.

[21] Appl. No.: 821,117

[22] Filed: Mar. 19, 1997

Related U.S. Application Data

[63] Continuation of Ser. No. 239,182, May 6, 1994, Pat. No. 5,640,113.

[51] Int. Cl.⁶ .................................................... H03L 7/00
[52] U.S. Cl. ........................ 326/162; 327/141; 327/263
[58] Field of Search ................................. 327/141, 142, 327/143, 162, 163, 186, 198, 79, 104, 263, 267, 451; 361/3, 5, 8

[56] References Cited

U.S. PATENT DOCUMENTS

| | | | |
|---|---|---|---|
| 3,665,212 | 5/1972 | Roberts et al. | 307/252 |
| 3,701,013 | 10/1972 | Gilmore | 327/12 |
| 3,950,657 | 4/1976 | Sheng et al. | 307/252 |
| 4,010,386 | 3/1977 | Rossell | 327/451 |
| 4,051,394 | 9/1977 | Tieden | 327/79 |
| 4,334,184 | 6/1982 | Hauenstein | 323/235 |
| 4,356,525 | 10/1982 | Kornrumpf et al. | 361/3 |
| 4,360,847 | 11/1982 | Bloomer et al. | 361/3 |
| 4,384,716 | 5/1983 | Powers | 361/152 |
| 4,631,627 | 12/1986 | Morgan | 361/153 |
| 4,642,481 | 2/1987 | Bielinski et al. | 327/252 |
| 4,704,652 | 11/1987 | Billings | 361/5 |
| 4,864,157 | 9/1989 | Dickey | 361/5 |
| 5,267,120 | 11/1993 | Graff et al. | 361/185 |

*Primary Examiner*—Toan Tran
*Attorney, Agent, or Firm*—Townsend and Townsend and Crew LLP

[57] ABSTRACT

A relay control circuit that includes a zero cross detector, a latch, and a delay circuit. The zero cross detector circuit detects when the voltage waveform or current waveform on an AC power line is at the zero crossing. The output of the zero cross detector clocks the latch (flip-flop), which receives a control signal at its data input. The flip-flop latches the control signal on the zero crossing point and outputs the latched signal to the delay circuit. The delay circuit delays the control signal for a predetermined time period depending on the make and break times of the relay so that the relay is switched ON and OFF substantially near the next zero crossing point of the AC voltage waveform.

8 Claims, 6 Drawing Sheets

ZERO CROSSING CIRCUIT FOR A RELAY

This is a continuation of Application Ser. No. 08/239,182, filed May 6, 1994, now U.S. Pat. Ser. No. 5,640,113.

BACKGROUND OF THE INVENTION

The present invention relates to a method and apparatus for controlling the operation of a relay. More specifically, the present invention relates to a method and apparatus for switching a relay ON and OFF at or near the zero crossing point of an AC waveform.

Relays are used to switch many electrical appliances ON and OFF connecting and disconnecting the appliance from an AC power source, respectively, in response to a control signal. One category of electrical appliances that are commonly controlled by relays are electronic ballasts that are switched ON and OFF in response to a sensing device such as a motion detector.

When switching an electrical appliance such as an electronic ballast or an incandescent light ON and OFF with a relay, relay contact must be made at or near specific points along the AC voltage waveform—the zero crossing points. If contact is made or broken at random points along the AC voltage waveform, contact may be made when the waveform is at a sufficient voltage level to cause high temperature electrical arcs to form between the relay contacts. The formation of these arcs is referred to as arcing. Arcing causes contact erosion and reduces the useful service life of the relay.

A consideration that must be taken into account in designing a circuit that switches relays ON and OFF near the zero crossing point is the turn-on and turn-off time of the relay, also referred to as the "make" and "break" times of the relay, respectively. FIG. 1 is a timing diagram showing the delay that occurs in making and breaking relay contact. In FIG. 1, an ON/OFF control signal 100, an AC voltage waveform 105, and a relay contact signal 110 are shown. When ON/OFF control signal 100 is switched to ON at point 115, the delay in making relay contact at point 120 is shown by time $T_{ON}$. Since the voltage of waveform 105 is not near zero volts at point 120, making relay contact at this point can damage the relay.

Similarly, when ON/OFF control signal 100 is switched to OFF at point 125, the delay in breaking relay contact at point 130 is shown by time TOFF. Since the voltage of waveform 105 is not near zero volts at point 130, breaking relay contact at this point can damage the relay. Many relays have make and break times that are equal to each other ($T_{ON}=T_{OFF}$). Other relays, however, have differing make and break times.

Previous circuits have been designed to account for the turn-on time of a relay and switch the relay on near the zero crossing point. One example of such a circuit is in U.S. Pat. No. 4,642,481 issued to Bielinski, et al. Another example is in U.S. Pat. No. 5,267,120 issued to Graff, et al. These prior art circuits, however, are complicated in both structure and number of components making them expensive to use on a mass production scale in highly competitive markets. Additionally, none of the prior art relay control circuits provide different delay times to ensure that relays which have different turn-on and turn-off times are both opened and closed at the zero crossing circuit.

SUMMARY OF THE INVENTION

The present invention solves the problems associated with the prior art by providing a simple and elegant circuit design that can ensure a relay is both turned ON and switched OFF at or near the zero crossing point.

In one embodiment of the present invention, a zero cross detector circuit detects when the voltage waveform on an AC power line is at the zero crossing. The output of the zero cross detector clocks a flip-flop, which receives a control signal at its data input. The flip-flop latches the control signal on the zero crossing point and outputs the latched signal to a delay circuit. The delay circuit delays the control signal for a predetermined time period depending on the make and break times of the relay so that the relay is switched ON and OFF substantially near the next zero crossing point of the AC voltage waveform. The zero cross detector circuit in this embodiment is referred to as a voltage sensing detector.

In another embodiment of the present invention, the zero cross detector circuit detects when the current waveform on an AC power line is at the zero crossing. This embodiment is particularly useful when the relay is controlling an inductive load, which has a low power factor. The zero cross detector circuit in this embodiment is referred to as a current sensing detector.

In still another embodiment of the present invention, the delay circuit delays the control signal for a first predetermined time period in relation to the make time of the relay and it delays the control signal for a second predetermined time period in relation to the break time of the relay.

DESCRIPTION OF THE PREFERRED EMBODIMENT

Figure 2A:
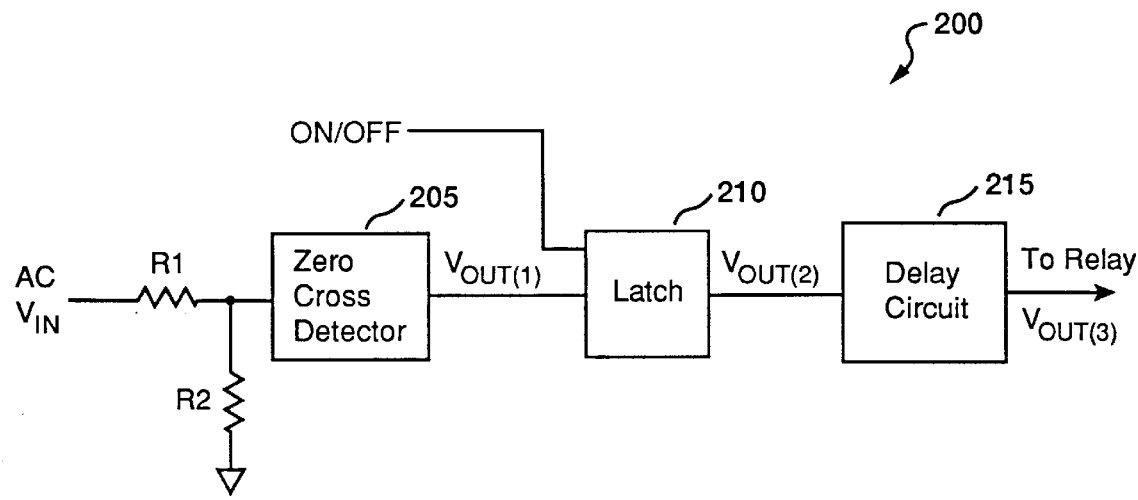
FIG. 2A is a block diagram of one embodiment of the relay control circuit according to the present invention.

FIG. 2A is a block diagram of one embodiment of a relay control circuit 200 according to the present invention. Relay control circuit 200 includes zero cross detector 205 for detecting whenever an AC voltage waveform crosses the zero voltage threshold, a latch 210 for latching an ON/OFF relay control signal, and a delay circuit 215 for delaying the latched ON/OFF relay control signal an appropriate period of time to switch the relay ON and OFF at or near the zero crossing level.

Figure 3:
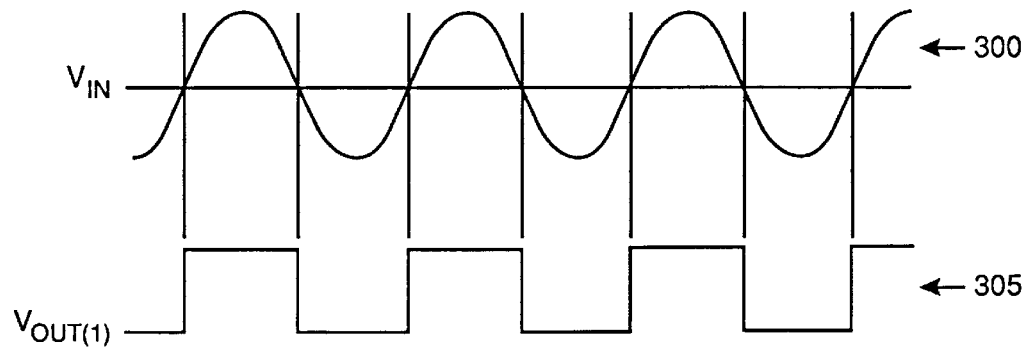
FIG. 3 is a timing diagram showing the AC voltage input to the zero cross detector shown in FIG. 2 and the voltage output from the zero cross detector.

Zero cross detector 205 inputs an AC voltage waveform, $V_{IN}$, and produces an output signal that inverts on each zero crossing of the AC waveform. AC voltage waveform $V_{IN}$ is reduced to an AC voltage waveform within the operating range of zero cross detector 205 by a voltage divider made up of resistors R1 and R2. The reduced AC voltage waveform input to zero cross detector 205 is shown in FIG. 3, which is a timing diagram showing the input to and output from zero cross detector 205, as waveform 300. The output of zero cross detector 205 is $V_{OUT(1)}$ and is also shown in FIG. 3 as waveform 305.

As shown, zero cross detector 205 is a voltage sensing detector, which is most efficient when the relay switches loads having a high power factor ON and OFF. Zero cross detector 205 can also be a current sensing detector, however, which detects each zero crossing of an AC current waveform input to zero cross detector 205. A current sensing detector is most efficient for controlling a relay that switches loads with low power factors, such as inductive loads, ON and OFF.

Referring back to FIG. 2A, latch 210 is a D flip-flop which inputs at its data input an ON/OFF relay control signal and inputs at its clock input the output of zero cross detector 210. Thus, latch 210 latches the relay control signal to zero crossing points of waveform 300.

Delay circuit 215 delays the latched control signal so that the relay being controlled is switched ON and OFF at or near a zero crossing point. The amount of delay introduced by delay circuit 215 depends on the relay being controlled and is described in detail with respect to the various embodiments of delay circuit 215 shown in FIGS. 5a–c.

Figure 1:
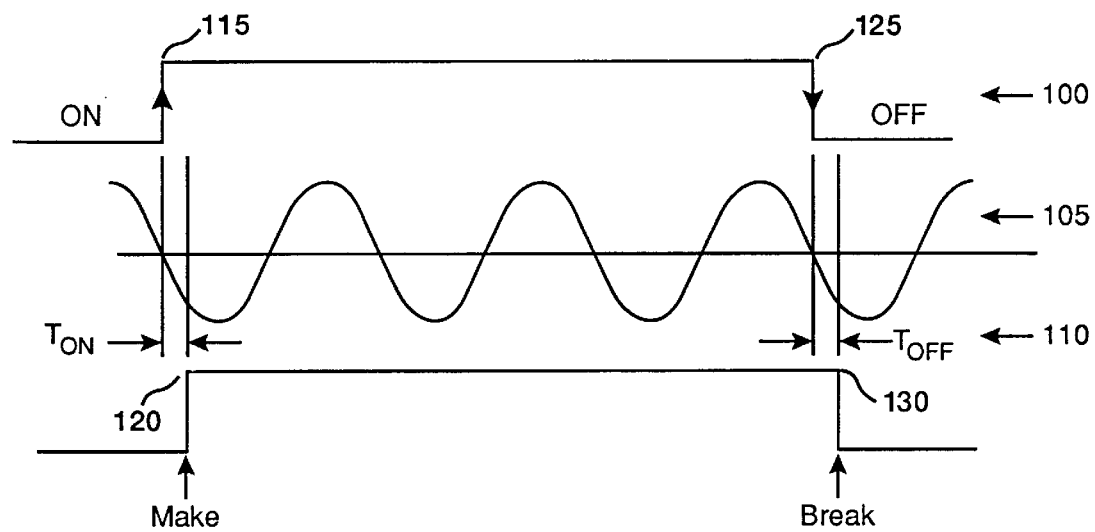
FIG. 1 is a timing diagram showing the delay that occurs in making and breaking relay contact.
Figure 4:
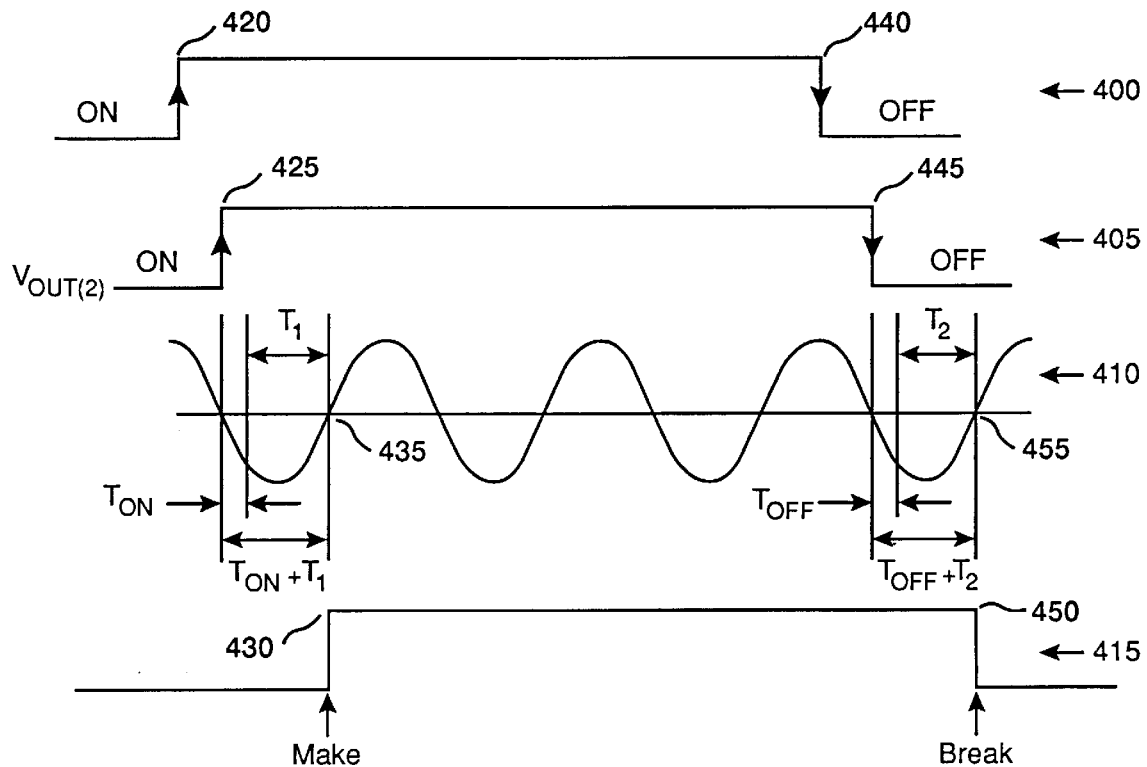
FIG. 4 is a timing diagram showing where relay contact is made and broken when using the relay control to circuit shown in FIG. 2.

The operation of relay control circuit 200 is shown in FIG. 4, which is a timing diagram showing when relay contact is made and broken in response to ON/OFF control signal 100. In FIG. 4, an ON/OFF control signal 400, waveform 405 output from latch 210, an AC voltage waveform 410, and a relay contact signal 415 are shown. When ON/OFF control signal 400 is asserted ON at point 420, latch 210 passes the control signal through its output timed with the zero crossing of AC waveform 410 as shown by point 425 of waveform 405. Delay circuit 215 delays the output of latch 210 by time $T_1$, so that when the relay's turn-on time TON is added to T, relay contact is actually made at point 430 of waveform 415 at the next zero crossing point 435 of AC waveform 410.

When ON/OFF control signal 400 is asserted OFF at point 440, latch 210 passes the control signal through its output timed with the zero crossing of AC waveform 410 as shown by point 445 of waveform 405. Delay circuit 215 delays the output of latch 210 by time $T_2$ so that when the relay's turn-off time $T_{OFF}$ is added to $T_1$, relay contact is actually broken at point 450 of waveform 415 at the next zero crossing 455 of AC waveform 410.

Figure 5A:
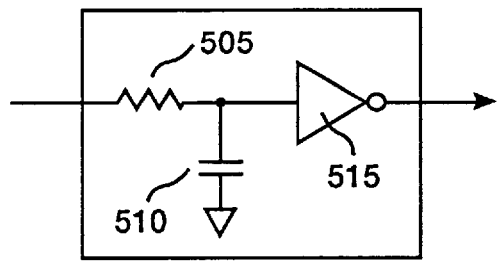
FIG. 5A is a circuit diagram of one embodiment of the delay circuit shown in FIG. 2.

FIG. 5A is a circuit diagram of one embodiment of delay circuit 215 shown in FIG. 2A. In FIG. 5A, delay circuit 215 includes a resistor 505, a capacitor 510, and an inverter 515. The FIG. 5A embodiment of delay circuit 215 works best with relays that have equal make and break times because it delays switching a relay ON the same amount of time as it delays switching a relay OFF. Thus, for the embodiment of delay circuit 215 shown in FIG. 5A, delay time T, is equal to delay time $T_2$.

The amount of time making and breaking relay contact is delayed is determined by the chosen values of resistor 505 and capacitor 510 and calculated by R*C as is well known to those skilled in the art. The values of resistor 505 and capacitor 510 are chosen depending on the make and break times of the relay being controlled. The values do not need to be chosen so that relay contact is made and broken at exactly the zero crossing point every time, and in fact, because of slight variations in the resistance and capacitance of individual resistors and capacitors having contact made and broken at exactly the zero crossing point is impossible. The values should be chosen, however, so that relay contact is made/broken at least within ±44.4 degrees of the zero crossing point to ensure that the energy generated at contact is always less than the average energy that is generated if contact is randomly made and broken—70% peak value. Most preferably, values are chosen so that when resistor manufacturing tolerances are considered the make and break time of the controlled relay occurs within ±18 degrees of the zero crossing point. Ensuring that relay contact occurs within ±18 degrees ensures that the contact energy is less than 10% of its peak value.

Figure 6:
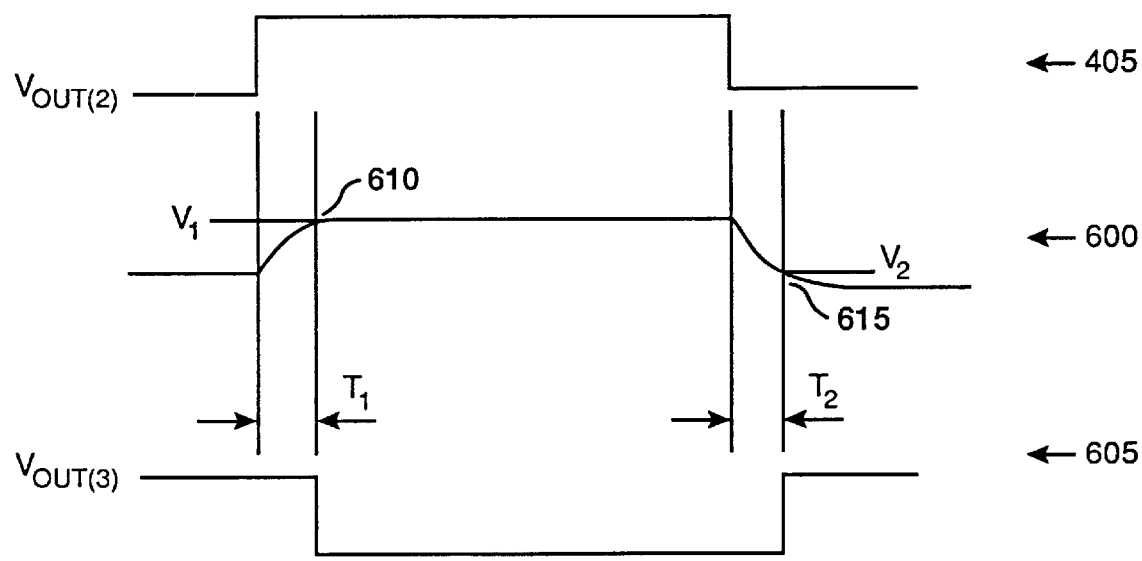
FIG. 6 is a timing diagram of the output of relay control circuit shown in FIG. 2 using the delay circuit shown in FIG. 5A.

FIG. 6 is a timing diagram of the output of relay control circuit 200 using delay circuit 215 shown in FIG. 5A. For convenience, the same reference numbers used in FIG. 4 are used in FIG. 6 to refer to like waveforms. In FIG. 6, waveform 405 is output from latch 210 to delay circuit 215, waveform 600 is voltage waveform input to inverter 515, and waveform 605 is the voltage waveform output from delay circuit 215.

As shown in FIG. 6A, when the rising edge of waveform 405 is input to delay circuit 215, resistor 505 and capacitor 510 slow the rise of waveform 600. Inverter 515 inverts its output when the voltage on waveform 600 increases to voltage level $V_1$ as indicated point 610. The time it takes waveform 600 to raise to voltage level $V_1$ is indicated by time $T_1$ and represents the delay time delay circuit 215 delays the turn-on of the relay. Similarly, when the falling edge of waveform 405 is input to delay circuit 215, inverter 515 inverts its output when the voltage on waveform 600 decreases to voltage level $V_2$ as shown by point 615. The time it takes waveform 600 to decay to voltage level $V_2$ is indicated by time $T_2$ and represents the delay time delay circuit delays the turn-off of the relay. Thus, inverter 515 provides for a clean signal transition being output from delay circuit 215 to switch the relay ON and OFF.

Figure 5B:
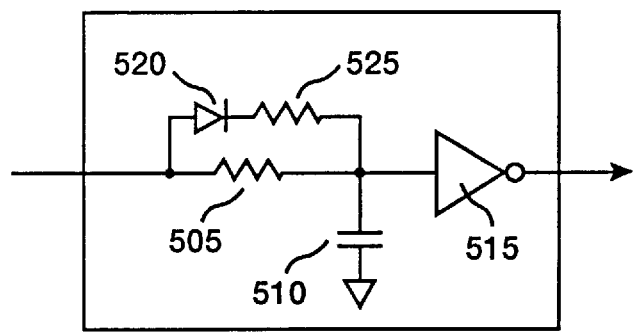
FIG. 5B is a circuit diagram of a second embodiment of the delay circuit shown in FIG. 2.

FIG. 5B is a circuit diagram of a second embodiment of delay circuit 215 shown in FIG. 2A. For convenience, the same reference numerals used in FIG. 5A are used in FIG. 5B to refer to like elements. In FIG. 5B, delay circuit 215 includes resistor 505, capacitor 510, inverter 515, a diode 520, and a resistor 525. The FIG. 5B embodiment of delay circuit 215 delays making relay contact a shorter period of time than it delays breaking relay contact. Thus, for the embodiment of delay circuit 215 shown in FIG. 5B, delay time $T_1$ is less than delay time $T_2$.

When the output of latch 210 switches from low to high and capacitor 510 is being charged, current flows through resistor 525 and diode 520 as well as resistor 505. Thus, the time delay introduced to make relay contact is determined mostly by the chosen values of resistor 505, capacitor 510, and resistor 525 in a manner well known to one skilled in the art (the voltage drop across diode 520 and other propagation delays are insignificant).

When the output of latch 210 switches from high to low and capacitor 510 is discharged, current flow through resistor 525 is blocked by diode 520. Faced with greater resistance during the discharge cycle, the time delay $T_2$ is greater than the delay time $T_1$. The actual time delay introduced to break relay contact is determined by the values of resistor 505 and capacitor 510 in the same manner as described in relation to FIG. 5A.

Figure 5C:
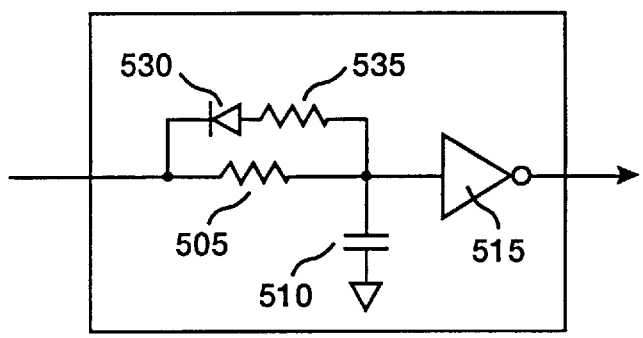
FIG. 5C is a circuit diagram of a third embodiment of the delay circuit shown in FIG. 2.

FIG. 5C is a circuit diagram of a third embodiment of delay circuit 215 shown in FIG. 2A. For convenience, the same reference numerals used in FIG. 5A are used in FIG. 5C to refer to like elements. In FIG. 5C, delay circuit 215 includes resistor 505, capacitor 510, inverter 515, a diode 530, and a resistor 535. The FIG. 5C embodiment of delay circuit 215 delays making relay contact for a longer period of time than it delays breaking relay contact. Thus, for the embodiment of delay circuit 215 shown in FIG. 5B, delay time $T_1$ is greater than $T_2$.

When the output of latch 210 switches from low to high and capacitor 510 is being charged, current flow through resistor 535 is blocked by diode 530, and thus, only flows through resistor 505. Therefore, the time delay introduced to make relay contact is determined mostly by the chosen values of resistor 505 and capacitor 510 in the same manner as described in relation to FIG. 5A.

When the output of latch 210 switches from high to low and capacitor 510 is discharged, current flows through resistor 535 and diode 530 as well as resistor 505. Faced with less resistance during the discharge cycle, the time delay $T_2$ is less than time delay $T_1$. The actual time delay introduced to break relay contact is determined by the values of resistor 505, capacitor 510, and resistor 535 in a manner well known to those skilled in the art.

Figure 7:
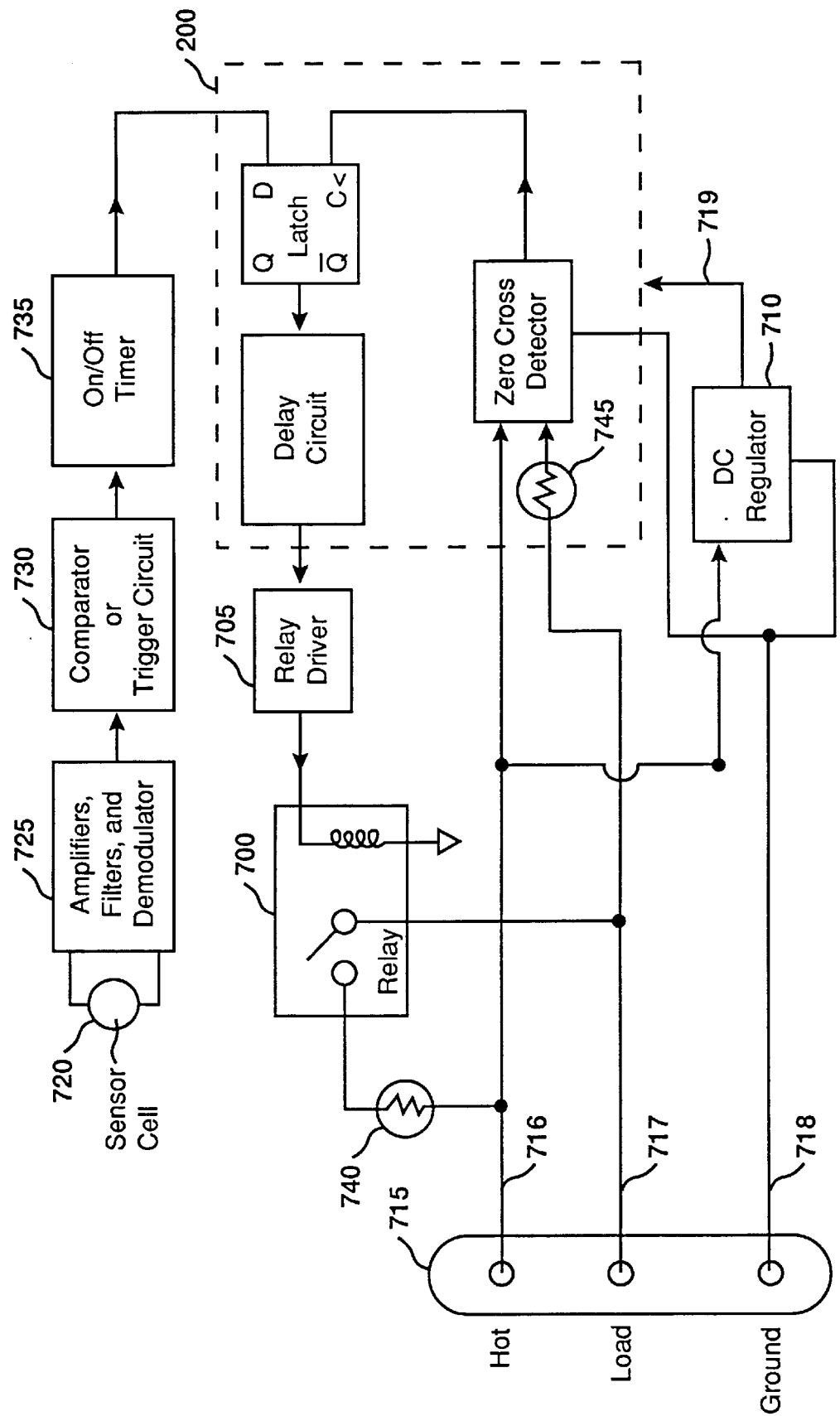
FIG. 7 is a block diagram of the relay control circuit of the present invention being used with a light detector to switch an electronic ballast ON and OFF.

FIG. 7 is a block diagram of relay control circuit 200 being used with a light detector to switch an electronic ballast ON and OFF. In addition to relay control circuit 200, a relay 700; a relay driver 705; a DC regulator 710; AC power line 715, including a hot line 716, a load line 717, and a ground line 718; a sensor cell 720; an amplifier circuit 725; a trigger circuit 730; and timer 735 are shown in FIG. 7.

In the operation of controlling an electronic ballast, shown as a load 740, a 60 hertz, 120 volt AC power is received over AC power line 715. The ballast is connected to AC power line 715 by hot line 716 and load line 717 through relay 700. When relay 700 is closed, the ballast receives electricity and the light is switched ON. When relay 700 is open, the light is switched OFF.

DC regulator 710 provides a constant DC power supply to each of the elements in relay control circuit 200 over a signal path 719 and can also supply a constant DC power source to sensor cell 720, amplifier 725, trigger circuit 730, and timer 735, if necessary.

Sensor cell 720 detects occupancy of a room in which the ballast is situated. Signals from sensor cell 720 are filtered, amplified, and demodulated by amplifier circuit 725, and trigger circuit 730 generates an ON signal from the amplified signal if the lights connected to the ballast should be switched ON. Finally, timer 735 generates a signal to switch the lights OFF if, after a predetermined time period, no motion is detected by sensor 720.

The output trigger circuit 730 and timer 735 is input to relay control circuit 200, which, in the manner described above, provides a signal to relay driver 705 that switches relay 700 ON and OFF.

As shown in FIG. 7, relay control circuit 200 inputs both hot line 716 and load line 717 to zero cross detector 205. Zero cross detector 205 can be either voltage sensing or current sensing. The zero crossing of the voltage level is sensed on hot line 716, while the zero crossing of the current, which may lead the voltage if load 740 is inductive, is sensed on load line 717. The current on load line 717 is converted to a voltage level by a current sensing device 745 such as a resistor or diode. A switch on zero crossing detector 205 can be used to allow selection between a voltage or current sensing zero cross detector, or optionally, circuitry could be included to detect if load 740 is inductive and thus has a low power factor. If the circuitry detects an inductive load, zero cross detector 205 could automatically adapt to a current sensing mode, while if the load has a high power factor, zero cross detector 205 could adapt a voltage sensing mode.

Of course, although FIG. 7 shows the present invention being used in a three wire AC power system, it can also be used with a two wire AC power system. In a two wire system, zero cross detector 205 senses voltage on the hot line and current on the neutral line.

Having fully described the preferred embodiments of the present invention, many other equivalent or alternative methods of implementing the relay control circuit will be apparent to those skilled in the art. For example, latch 210 can be implemented with flip-flops and latches other than a D flip-flop, and delay circuit 215 can be implemented with many different combinations of resistors, capacitors, operational amplifiers, and voltage comparators. Some or all of the various resistors in delay circuit 215 can potentiometers which can be tuned to different resistance levels depending on the relay controlled.

Figure 2B:
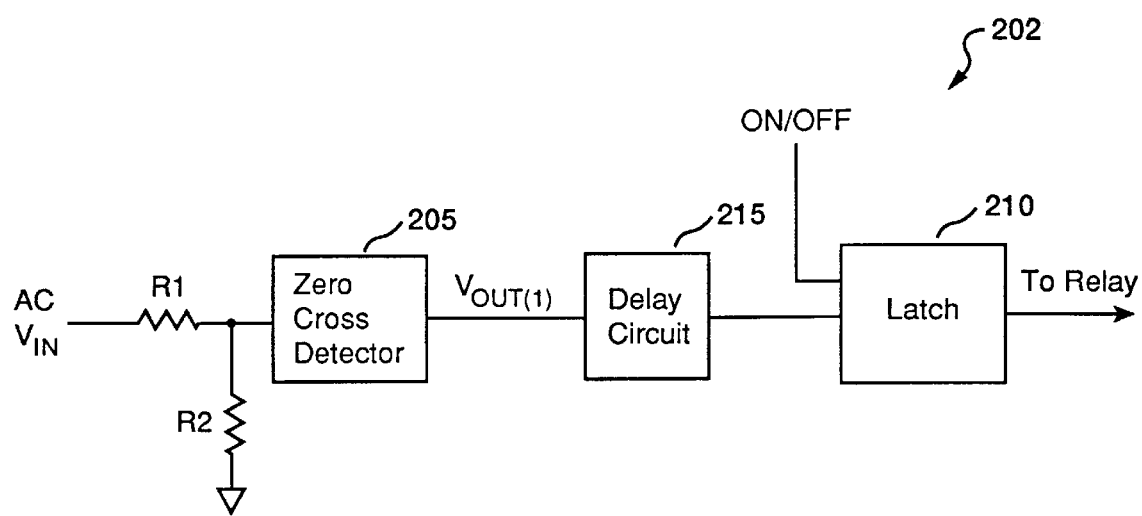
FIG. 2B is a block diagram of one embodiment of the relay control circuit according to the present invention.

Additionally, delay circuit 215 can be situated between zero cross detector and latch 210 to delay clocked ON/OFF control signal 405 for a time period $T_1$ or $T_2$ so the $T_{ON}$ or $T_{OFF}$ represents delay between the output of latch 210 and making or breaking relay contact at a zero crossing point, respectively. A relay control circuit 202 of this type is shown in FIG. 2B. For convenience, the same reference numerals used in FIG. 2A are used in FIG. 2B to refer to like elements. Zero cross detector 205 could produce a pulse each zero crossing of the AC waveform while latch 210 would be clocked on each pulse. These equivalents and alternatives are intended to be included within the scope of the present invention.

What is claimed is:

1. A relay control circuit for controlling an electromechanical relay which switches a circuit, said relay control circuit comprising:
    (a) a zero cross detector for detecting when an AC signal crosses a zero-crossing point; and
    (b) a delay element, coupled to said zero cross detector and coupled to a coil of the electromechanical relay, configured to delay a relay ON/OFF signal a predetermined period of time, said delay element including:
        i) a flip-flop for latching said relay ON/OFF signal to produce a latched relay ON/OFF signal; and
        ii) a delay circuit for delaying the latched relay ON/OFF signal said predetermined period of time wherein said flip-flop is coupled at an input to said zero cross detector and coupled at an output to said delay circuit, and wherein said predetermined time period is selected so that the electromechanical relay switches substantially at a zero-crossing point.

2. A relay control circuit to prevent arcing that occurs in an electromechanical relay when relay contact is made to an AC power line and the energy level on the AC power line is at an energy level other than zero, said relay control circuit comprising:
    (a) a zero cross detector, coupled to the AC power line, for outputting a signal which indicates each time the energy level on the AC power line becomes zero;
    (b) a flip-flop, coupled to said zero cross detector, which receives a control signal at a data input and receives the signal output from said zero cross detector at a clock input, for latching the control signal when the energy on the AC power line is zero to produce a latched control signal; and (c) a delay circuit, coupled to an output of said flip-flop and coupled to a coil of the electromechanical relay, for delaying said latched control signal for a predetermined time period so that relay contact is made to the AC power line substantially near the zero-crossing level.

3. A method of switching an electromechanical relay ON and OFF substantially near the zero-crossing of an AC power line, said method comprising the steps of:

(a) detecting a first zero-crossing point on the AC power line;

(b) latching a relay control signal, using a flip-flop, when said crossing point is detected to produce a latched relay control signal;

(c) delaying said latched relay signal a predetermined amount of time selected in dependence on a make time of the electromechanical relay, thereby creating a delayed latched signal; and (d) supplying said delayed latched signal to a coil of the electromechanical relay, thereby causing the electromechanical relay to switch ON substantially near a second zero-crossing point.

4. A relay control circuit for controlling an electromechanical relay that switches a light coupled to an electronic ballast ON and OFF in response to a control signal from a motion detector, said relay control circuit comprising:

(a) a zero cross detector for detecting when an AC power signal powering said light crosses a zero-crossing point; and (b) a delay element, coupled to said zero cross detector and coupled to a coil of the electromechanical relay, configured to delay said control signal a predetermined period of time so that relay contact is made and broken substantially near a zero-crossing point, said delay element including:
  i) a flip-flop for latching said control signal, said latching of said control signal producing a latched control signal; and
  ii) a delay circuit for delaying said latched control signal said predetermined period of time, wherein said flip-flop is coupled between said zero cross detector and said delay circuit.

5. A relay control circuit for controlling an electromechanical relay which switches a circuit comprising:

(a) a zero cross detector for detecting when an AC signal crosses a zero-crossing point; and (b) a delay element, coupled to said zero cross detector, configured to delay a relay ON/OFF signal a predetermined period of time, said delay element including:
  i) a flip-flop for latching said relay ON/OFF signal; and
  ii) a delay circuit for delaying the coupled at an input to said zero cross detector and at an output to said flip-flop, for producing a pulse for clocking said flip-flop to change state after each zero-crossing.

6. A relay control circuit for controlling an electromechanical relay which switches a circuit, said relay control circuit comprising:

(a) a zero cross detector for detecting when an AC signal crosses a zero-crossing point; and (b) a delay element, coupled to said zero cross detector and coupled to a coil of the electromechanical relay, configured to delay a relay ON/OFF signal a predetermined period of time, said delay element including:
  i) a flip-flop for latching said relay ON/OFF signal to produce a latched relay ON/OFF signal; and
  ii) a delay circuit, coupled to an output of said flip-flop and coupled to a coil of the electromechanical relay, for delaying said latched relay ON/OFF signal said predetermined period of time, wherein said flip-flop comprises a D flip-flop, and wherein said delay circuit comprises a first resistor and a capacitor, and a second resistor and a diode coupled in parallel with said first resistor.

7. A relay control circuit to prevent arcing that occurs when relay contact is made to an AC power line and the energy level on the AC power line is at an energy level other than zero, said relay control circuit comprising:

(a) a zero cross detector, coupled to the AC power line, for outputting a signal which indicates each time the energy level on the AC power line becomes zero;

(b) a flip-flop, coupled to said zero cross detector, which receives a control signal at a data input and receives the signal output from said zero cross detector at a clock input, for latching the control signal when the energy on the AC power line is zero, said latching of said control signal producing a latched control signal; and (c) a delay circuit, coupled to an output of said flip-flop and coupled to a coil of the electromechanical relay, for delaying said latched control signal for a predetermined time period so that relay contact is made to the AC power line substantially near the zero-crossing level, wherein said delay circuit comprises a first resistor and a capacitor, and wherein said delay circuit further comprises an inverter coupled at an input to said first resistor and said capacitor.

8. A method of switching an electromechanical relay ON and OFF substantially near the zero-crossing of an AC power line, said method comprising the steps of:

(a) detecting a first zero-crossing point on the AC power line;

(b) delaying a relay control signal after detecting said first zero-crossing point by a predetermined amount of time selected in dependence on a make time of the electromechanical relay, thereby creating a first delayed latched signal;

(c) supplying said first delayed latched signal to a coil of the electromechanical relay, thereby causing the electromechanical relay to switch ON substantially near a second zero-crossing point;

(d) detecting a third zero-crossing point on the AC power line;

(e) delaying the control signal a second predetermined amount of time depending on a break time of the electromechanical relay, thereby creating a second delayed latched signal; and (f) supplying said second delayed latched signal to a coil of the electromechanical relay, thereby causing the electromechanical relay to switch OFF substantially near a fourth zero-crossing point.

* * * * *